(12) United States Patent
Nakako et al.

(10) Patent No.: US 9,457,406 B2
(45) Date of Patent: Oct. 4, 2016

(54) COPPER METAL FILM, METHOD FOR PRODUCING SAME, COPPER METAL PATTERN, CONDUCTIVE WIRING LINE USING THE COPPER METAL PATTERN, COPPER METAL BUMP, HEAT CONDUCTION PATH, BONDING MATERIAL, AND LIQUID COMPOSITION

(75) Inventors: Hideo Nakako, Tsukuba (JP); Kazunori Yamamoto, Tsukuba (JP); Yasushi Kumashiro, Chikusei (JP); Shunya Yokosawa, Tsukuba (JP); Katsuyuki Masuda, Tsukuba (JP); Yoshinori Ejiri, Chikusei (JP); Maki Inada, Tsukuba (JP); Kyoko Kuroda, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 537 days.

(21) Appl. No.: 13/496,550

(22) PCT Filed: Sep. 13, 2010

(86) PCT No.: PCT/JP2010/065698
§ 371 (c)(1),
(2), (4) Date: Mar. 16, 2012

(87) PCT Pub. No.: WO2011/034016
PCT Pub. Date: Mar. 24, 2011

(65) Prior Publication Data
US 2012/0175147 A1 Jul. 12, 2012

(30) Foreign Application Priority Data

Sep. 16, 2009 (JP) .............................. P2009-215003

(51) Int. Cl.
*B22F 3/24* (2006.01)
*B22F 9/26* (2006.01)
(Continued)

(52) U.S. Cl.
CPC ................ *B22F 9/26* (2013.01); *B32B 15/01* (2013.01); *C22C 5/04* (2013.01); *C22C 9/00* (2013.01);
(Continued)

(58) Field of Classification Search
None
See application file for complete search history.

(56) References Cited

U.S. PATENT DOCUMENTS 4,555,414 A * 11/1985 Hoover et al. ................. 427/504
5,382,333 A * 1/1995 Ando ...................... C23C 22/63
156/150

(Continued)

FOREIGN PATENT DOCUMENTS

JP 3-255695 11/1991
JP 2002-270609 9/2002

(Continued)

OTHER PUBLICATIONS

English Translation of JP03255695A, Phoenix Translations, Dec. 2014.*

(Continued)

*Primary Examiner* — Adam Krupicka
(74) *Attorney, Agent, or Firm* — Fitch, Even, Tabin & Flannery, LLP

(57) ABSTRACT

Disclosed are: a copper metal film which has good adhesion to a substrate, low volume resistivity, and good deep-part metal properties; and a method for producing a copper metal film, wherein the copper metal film can be produced by reducing a substrate to a deep part thereof without damaging the substrate. Specifically disclosed is a copper metal film obtained by treating a copper-based particle deposition layer containing both copper oxides and a metallic transition metal or alloy, or a transition metal complex containing a metal element, with gaseous formic acid and/or formaldehyde heated to 120° C. or higher. The copper oxide is preferably copper (I) oxide and/or copper (II) oxide. The transition metal, alloy or metal complex are preferably a metal selected from the group consisting of Cu, Pd, Pt, Ni, Ag, Au and Rh, an alloy containing the metal, or a complex containing the metal element, respectively.

13 Claims, 3 Drawing Sheets

(51) Int. Cl.
  *B32B 15/01* (2006.01)
  *C22C 5/04* (2006.01)
  *C22C 9/00* (2006.01)
  *H01B 1/02* (2006.01)
  *H05K 3/12* (2006.01)
  *B22F 9/22* (2006.01)
  *B22F 1/02* (2006.01)
  *H05K 1/09* (2006.01)
  *H05K 3/10* (2006.01)

(52) U.S. Cl.
  CPC ............ *H01B 1/026* (2013.01); *H05K 3/1283* (2013.01); *B22F 1/02* (2013.01); *B22F 9/22* (2013.01); *B22F 2201/01* (2013.01); *B22F 2301/10* (2013.01); *B22F 2302/25* (2013.01); *H05K 1/097* (2013.01); *H05K 3/105* (2013.01); *H05K 2201/0224* (2013.01); *H05K 2201/0272* (2013.01); *H05K 2203/0315* (2013.01); *H05K 2203/1131* (2013.01); *H05K 2203/1157* (2013.01); *Y10T 156/10* (2015.01); *Y10T 428/12903* (2015.01)

(56) References Cited

U.S. PATENT DOCUMENTS

| | | | |
|---|---|---|---|
| 6,512,186 B1 * | 1/2003 | Nishiwaki et al. | 174/261 |
| 8,801,971 B2 * | 8/2014 | Nakako | C23C 18/1601 252/500 |
| 2002/0092584 A1 | 7/2002 | Soininen et al. | |
| 2005/0269209 A1 * | 12/2005 | Sandoval et al. | 205/586 |
| 2008/0000416 A1 * | 1/2008 | Miyoshi et al. | 118/50.1 |

FOREIGN PATENT DOCUMENTS

| | | |
|---|---|---|
| JP | 2003-533880 | 11/2003 |
| JP | 2004-119686 | 4/2004 |
| JP | 2004-162110 | 6/2004 |
| JP | 2007-87735 | 4/2007 |
| JP | 2007-314866 | 12/2007 |
| JP | 4155821 | 7/2008 |
| JP | 2008-200557 | 9/2008 |
| JP | 2009-196249 | 9/2009 |
| TW | 508658 B | 11/2002 |
| TW | 200930186 | 7/2009 |
| WO | WO 01/88972 A1 | 11/2001 |
| WO | WO 02/35554 A1 | 5/2002 |
| WO | WO 2005/055305 A1 | 6/2005 |
| WO | WO 2009/054343 A1 | 4/2009 |
| WO | WO 2009/078448 | 6/2009 |

OTHER PUBLICATIONS

CN Office Action of Appln. No. 201080041044.9 dated Feb. 8, 2014 in counterpart application with English translation.
Notification of Transmittal of Translation of the International Preliminary Report on Patentability of International Appln. No. PCT/JP2010/065698 dated Apr. 19, 2012 in English.
Izumi et al., Photoresist Removal Using Atomic Hydrogen Generated by Heated Catalyzer, Japan J. Appl. Phys. vol. 41, 2002, pp. 4639-4641.
Hwang et al., Analysis of Initial Stage Sintering by Computer Simulation, Sintering and Heterogeneous Catalysis, 1983, pp. 35-47.
Communication Aug. 29, 2014, in connection with a Taiwanese Application, and English translation thereof, 16 pages.
Communication mailed Aug. 5, 2014, in connection with Japanese Application No. 2011-531915, and English translation thereof, 14 pages.
Communication mailed Aug. 22, 2014, in connection with Chinese Application No. 201080041044.9, and English translation thereof, 7 pages.
Office Action in KR Appln. No. 10-2012-7008376 dated Aug. 11, 2015 with English translation.
Office Action in counterpart CN Appln. No. 201410616539.X dated Jan. 12, 2016 with English translation.
Office Action in counterpart Korean Appln. No. 10-2012-7008376 dated Feb. 4, 2016 with English translation.
Office Action in counterpart KR Patent Application No. 10-2012-7008376 dated Mar. 14, 2016 with English translation.

* cited by examiner (A)　　　　　　　　　　　　(B)

COPPER METAL FILM, METHOD FOR PRODUCING SAME, COPPER METAL PATTERN, CONDUCTIVE WIRING LINE USING THE COPPER METAL PATTERN, COPPER METAL BUMP, HEAT CONDUCTION PATH, BONDING MATERIAL, AND LIQUID COMPOSITION

TECHNICAL FIELD

The present invention relates to a copper metal film obtainable by a gas treatment of formic acid or formaldehyde, a method for producing the copper metal film, a copper metal pattern, a conductor wiring using the copper metal pattern, a copper metal bump, a heat conduction path, a bonding material, and a liquid composition for forming a copper metal film.

BACKGROUND ART

Copper metal has high electrical conductivity and high heat conductivity, and is widely used as a conductor wiring material, a heat transfer material, a heat exchange material, and a heat dissipating material.

On the other hand, in inkjet printing, a jet dispenser, a needle dispenser, a dispenser, and printing form-based printing, since a liquid material can be applied on a material having an arbitrary shape without using a photoresist process, attention has been paid to these techniques from the viewpoints of on-demand production, power savings, material savings, and cost reduction. Particularly, in inkjet printing and a jet dispenser, where forming is made possible in a non-contact manner, printing can be achieved on steps, curved surfaces or small-area surfaces, and pattern formation that is impossible in printing form-based printing can be achieved.

As a printing ink for forming a copper metal pattern through such printing methods, there have been suggested a dispersion liquid of copper metal nanoparticles (see, for example, Patent Document 1), and a solution or dispersion liquid of a metal complex (see, for example, Patent Document 2). However, copper has a stable oxidation state at room temperature, and copper essentially contains copper atoms in the oxidized state. Therefore, in order for copper metal to exhibit electrical conductivity and heat conductivity, there is a need to reduce those copper atoms in the oxidized state and to prepare a continuum of copper metal.

Furthermore, in a printing ink that uses copper metal nanoparticles, there is a need, if the printing ink contains a dispersant, to first remove the dispersant before use, to subsequently reduce copper oxides, and to sinter/fuse copper metal particles to obtain a continuum. Examples of techniques for such removal of dispersant and/or reduction and sintering include (a) use of hydrogen after activation by an RF plasma method (see, for example, Patent Document 3) or a hot wire method (see, for example, Patent Document 4); (b) flash irradiation of xenon in a hydrogen atmosphere; (c) heating with a polyhydric alcohol having a valence of 3 or higher (see, for example, Patent Document 5); (d) heating in hydrogen gas; and the like.

However, such combinations of printing inks and techniques for reduction and sintering have problems in terms of low adhesiveness, peeling of treated printed layer, high volume resistivity, and deep-part reducibility. Thus, the printing inks could not be applied to conductor wiring materials, heat transfer materials, heat exchange materials, and heat dissipating materials.

The causes for the low adhesiveness, peeling of treated printing layer and high volume resistivity lie in the fact that the printing inks are porous sintered bodies obtained by sintering elemental metal-containing particles in the printing inks through reducing heating, and thereby connecting the particles. During the process of sintering of metal nanoparticles at a temperature much lower than the melting point of the metal, metal atoms migrate within the particles so as to reduce the surface area by utilizing the large surface energy carried by the powder particles and the externally applied energy as the driving force, and bonding/fusion between the particles proceeds (see, for example, Non-Patent Document 1). However, when bonding/fusion between the particles proceeds to a certain extent, and the specific surface area is reduced, the progress of fusion is decelerated and stops. As a result, a sponge-like sintered body is formed. This is because since metal atoms move, after all, only within the powder particles and do not actively precipitate out to the substrate surface, voids remain between the conductor layer and the substrate, and adhesiveness may not be obtained. In order to address such problems, there have been suggested hitherto a method of printing a conductor ink on a precursor of polyimide as a foundation resin (see, for example, Patent Document 6); a method of printing a conductor ink on a semi-cured epoxy resin (Japanese Patent Application No. 2008-267400); and a method of imparting fluidity to a resin that serves as the foundation, making the resin to conform to the conductor layer, and thereby obtaining adhesiveness. However, there are limitations on the foundation resin material or the production method.

For the same reasons, in the process of sintering of metal nanoparticles at a temperature much lower than the melting point of the metal, fusion between the particles stops at a time point at which the specific surface area has decreased to a certain extent along with the progress of sintering, and a porous sponge-like conductor layer is formed. Thereby, there is a problem in a conductorization treatment at or below 200° C. that the volume resistivity does not fall to a value 10 times or less the volume resistivity of bulk copper.

Furthermore, in the techniques of using hydrogen after activation as in item (a), it is reported that the same techniques are effective in the removal of oil films or in the removal of photoresist resins (RF plasma and surface wave plasma: see Patent Document 7, hot wire method atomic hydrogen treatment: see Non-Patent Document 2). As such, in the techniques of using hydrogen after activation, there is also a problem that resin substrates are damaged by activated hydrogen.

Furthermore, according to the investigations made by the inventors, in an activated hydrogen treatment by means of RF plasma or surface wave plasma, deep-part treatability to a depth of 2 μm or more is not obtained, and treatability of deep parts also poses a problem.

On the other hand, as another reduction technique, a reduction technique that uses formic acid gas is known. As a reduction technique that uses formic acid gas, it is reported that a formic acid reflow furnace is effective in the removal of oxide films on the copper and solder surfaces (see, for example, Patent Document 8). This formic acid reflow furnace produces copper formate by applying formic acid gas to copper oxides under heating at a predetermined temperature, and reduces the produced copper formate to produce copper metal. Thus, the formic acid reflow furnace is expected to be also effective in the reduction and metallization of printing inks.

CITATION LIST

Patent Documents

Patent Document 1: Japanese Patent No. 4155821
Patent Document 2: Japanese Patent Application Laid-Open (JP-A) No. 2004-162110
Patent Document 3: JP-A No. 2004-119686
Patent Document 4: WO 2009/054343
Patent Document 5: JP-A No. 2007-87735
Patent Document 6: JP-A No. 2008-200557
Patent Document 7: WO 2005/055305
Patent Document 8: Japanese Patent No. 3373499

Non-Patent Documents

Non-Patent Document 1: Hwang, K. S, and R. S. German; "Sintering and Heterogeneous Catalysis," 35, Plenum Press (1983)
Non-Patent Document 2: A. Izumi, H. Matsumura, Jpn. J. Appl. Phys., 41, (2002) 4639-4641

SUMMARY OF THE INVENTION

Problem to be Solved by the Invention

However, according to the investigation of the inventors of the present invention, it was found that in a formic acid gas treatment of a printing ink of copper oxide, copper metal precipitates out at printed areas, and at the same time, copper precipitates out in a large amount even on the substrate in the surroundings of applied areas. On the other hand, it was found that even when copper(II) formate is applied and heated to 160° C. under nitrogen, the copper formate-applied area turns into copper metal, and at the same time, precipitation of copper metal even in the surroundings of the applied area of copper(II) formate can be seen. From the above findings, it is speculated that in the formic acid gas treatment of printing ink, copper oxide and formic acid gas react with each other to produce copper formate, and then copper metal precipitates out as a result of thermal decomposition and reduction of copper formate; however, in addition to that, there is also a portion of copper formate which sublimes and thereby reaches areas other than the printing ink-applied area, so that such copper formate is decomposed on the spot and turns into copper metal, which in turn precipitates out. If the problem of precipitation of copper metal such as described above can be solved, the reduction technique that uses formic acid can solve various technological problems in the formation of copper metal, and is therefore useful.

The present invention was made in view of the problems of the related art as described above, and the present invention is intended to achieve the following objects.

That is, an object of the present invention is to provide a copper metal having satisfactory substrate adhesiveness, low volume resistivity and satisfactory deep-part metal properties, and a method for producing a copper metal film, which is capable of producing a copper metal film by reducing the copper metal film described above to deep parts without damaging a substrate.

Furthermore, another object of the present invention is to provide a copper metal pattern having excellent substrate adhesiveness and low volume resistivity, which is formed by printing without damaging a substrate; a conductor wiring using the copper metal pattern; a metal bump; a heat conduction path; and a bonding material.

Still another object of the present invention is to provide a liquid composition capable of forming a copper metal film or a copper metal pattern, which can be formed by printing and has satisfactory substrate adhesiveness, low volume resistivity and satisfactory deep-part metal properties.

Means for Solving the Problem

The inventors of the present invention speculated that if copper formate is decomposed and copper metal is precipitated out even before copper formate diffuses to the surroundings of the applied area through sublimation, precipitation of copper to areas other than the applied area, and conducted an investigation on catalysts. Thus, the inventors found that when a metallic transition metal or alloy, or a metal complex serving as a precursor of the transition metal or alloy, is allowed to co-exist as a catalyst in a copper-based particle deposition layer, copper metal is precipitated out at a temperature of 120° C. or higher, and at that time, precipitation of copper metal to a region other than the copper-based particle deposition layer is suppressed to a large extent, thus completing the present invention. That is, according to the present invention, during the formation of a copper metal film, when a copper-based particle deposition layer containing a transition metal or the like as described above is formed in an area where it is intended to form a copper metal film, and the particle deposition layer is heated in an atmosphere in which formic acid gas is present, a copper metal film can be selectively formed only in the copper-based particle deposition area.

Furthermore, as a result of the investigation, this technique is characterized in that precipitation of a dense copper metal film can be seen in the vicinity of the substrate surface, and the adhesiveness to the substrate, which is a matter of concern in an ink that uses nanoparticles containing a metal element, is excellent. In the conductorization treatment according to the present invention, it is believed that since the treatment is achieved through sublimable copper formate, copper atoms can diffuse by sublimation even to the outside of the particles, and thus, copper metal is precipitated out from the top of the catalyst metal or the top of the substrate. From this, excellent adhesiveness between a substrate and a copper metal film can be obtained without using a resin substrate which has been made to have conformance on the substrate side.

(1) A copper metal film obtained by treating a copper-based particle deposition layer containing both copper oxides and a metallic transition metal or alloy, or a transition metal complex containing a metal element, with gaseous formic acid and/or formaldehyde heated to 120° C. or higher.

(2) The copper metal film according to (1), wherein the copper oxides are cuprous oxide and/or cupric oxide.

(3) The copper metal film according to (1) or (2), wherein the transition metal, alloy and transition metal complex are a metal selected from the group consisting of Cu, Pd, Pt, Ni, Ag, Au and Rh, an alloy containing the metal, and a complex containing the metal element, respectively.

(4) The copper metal film according to any of (1) to (3), wherein as the copper oxides, and the metallic transition metal or alloy, or the transition metal complex containing a metal element, the copper metal film contains particles having a core/shell structure in which the core part is formed of the transition metal or alloy, and the shell part is formed of the copper oxides.

(5) The copper metal film according to any of (1) to (4), wherein the metallic transition metal is copper metal obtained by reducing a portion of the copper-based particle deposition layer.

(6) The copper metal film according to (5), wherein the technique for reducing a portion of the copper-based particle deposition layer is any one of (1) a hot wire method atomic hydrogen treatment, (2) a surface wave plasma treatment, (3) an RF plasma treatment, (4) heating under hydrogen, (5) a treatment using a treatment liquid which contains, in a single solution, both an agent which ionizes or complexates copper oxides, and a reducing agent which reduces copper ions or a copper complex to copper metal, but does not contain copper ions, and (6) an atomic hydrogen treatment through ultraviolet irradiation.

(7) The copper metal film according to any of (1) to (3), wherein the copper-based particle deposition layer is a layer obtained by depositing a particle mixture prepared by mixing particles formed of a metallic transition metal or alloy, or a transition metal complex containing a metal element, with copper oxide particles at an arbitrary ratio.

(8) The copper metal film according to any of (1) to (3), wherein the copper-based particle deposition layer is a layer obtained by depositing a particle mixture prepared by mixing particles formed of a metallic transition metal or alloy, or a transition metal complex containing a metal element, with particles having a core-shell structure in which the core part is formed of the metal and the shell part is formed of copper oxides, and with copper oxide particles, at an arbitrary ratio.

(9) The copper metal film according to any of (1) to (3), wherein the copper-based particle deposition layer is a layer obtained by depositing one or more layers containing copper oxide particles, on a layer obtained by depositing particles formed of a metallic transition metal or alloy, or a transition metal complex containing a metal element, with the layers being in contact.

(10) The copper metal film according to any of (1) to (3), wherein the copper-based particle deposition layer is a layer obtained by laminating a layer containing a metallic transition metal or alloy, or a transition metal complex containing a metal element, on a layer obtained by laminating one or more layers containing copper oxide particles.

(11) The copper metal film according to any of (1) to (3), wherein the copper-based particle deposition layer is a layer obtained by laminating one or more layers containing copper oxide particles, on a film containing a metallic transition metal or alloy, or a transition metal complex containing a metal element.

(12) A method for producing a copper metal film, including: treating a copper-based particle deposition layer containing both copper oxides and a metallic transition metal or alloy, or a transition metal complex containing a metal element, with gaseous formic acid and/or formaldehyde heated to 120° C. or higher.

(13) A patterned copper metal pattern obtained by treating a patterned layer by a treatment method of bringing the patterned layer into contact with gaseous formic acid and/or formaldehyde heated to 120° C. or higher, wherein a copper-based particle deposition layer containing both copper oxides and a transition metal or alloy, or a transition metal complex containing a metal element is patterned by printing.

(14) The patterned copper metal pattern according to (13), wherein the printing method used in the patterning of the copper-based particle deposition layer is any one selected from the group consisting of inkjet printing, super inkjet printing, screen printing, transfer printing, offset printing and jet printing methods, a dispenser, a needle dispenser, a comma coater, a slit coater, a die coater, and a gravure coater.

(15) A conductor wiring using the copper metal pattern according to (13) or (14).

(16) A copper metal bump using the copper metal pattern according to (13) or (14).

(17) A heat conduction path using the copper metal pattern according to (13) or (14).

(18) A bonding material using the copper metal pattern according to (13) or (14).

(19) A liquid composition, containing: copper oxides, a metallic transition metal or alloy, or a transition metal complex containing a metal element, and a solvent having a vapor pressure at 25° C. of less than $1.34 \times 10^3$ Pa, wherein the components are dispersed such that the average dispersion particle size is 500 nm or less and the maximum dispersion particle size is 2 μm or less, the content of the copper oxides is 1 to 80 parts by volume relative to 100 parts by volume of the total amount of the copper oxides, the metallic transition metal or alloy, or the transition metal complex containing a metal element, and the solvent.

(20) The liquid composition according to (19), wherein the transition metal, alloy and transition metal complex are respectively a metal selected from the group consisting of Cu, Pd, Pt, Ni, Ag, Au and Rh, an alloy containing the metal, and a complex containing the metal element.

(21) The liquid composition according to (19) or (20), wherein as the copper oxides and the metallic transition metal or alloy, or the transition metal complex containing a metal element, the liquid composition contains particles having a core/shell structure in which the core part is formed of the transition metal or alloy and the shell part is formed of the copper oxides.

(22) The liquid composition according to (19) or (20), wherein the complex containing a metal element constitutes a solution of the solvent, and the content of the complex is such that the weight of the metal atoms in the complex is 1 to 100 when the weight of the particles containing the copper oxides is taken as 100.

(23) The liquid composition according to (19) or (20), wherein the metal, the alloy containing the metal, or the complex containing the metal element is in a particulate form, the particles are dispersed to have a maximum dispersion particle size of 2 μm or less, and the surface area of the particles is 0.4 m$^2$ or more relative to 1 g of the weight of the particles containing copper oxides.

(24) The liquid composition according to any of (19) to (23), wherein the dynamic viscosity at 25° C. is 100 mPa·s or less.

The disclosure of the present patent application relates to the subject matter described in Japanese Patent Application No. 2009-215003 filed in Japan on Sep. 16, 2009, the disclosure of which is incorporated herein by reference.

Effect of the Invention

According to the present invention, there can be provided a copper metal film having satisfactory substrate adhesiveness, low volume resistivity and satisfactory deep-part metal properties, and a method for producing a copper metal film, capable of producing a copper metal film by reducing the film to deep parts without damaging the substrate.

Furthermore, according to the present invention, there can be provided a copper metal pattern having excellent substrate adhesiveness and low volume resistivity and formed by printing without damaging the substrate, and a conductor wiring, a metal bump, a heat conduction path and a bonding material, which all use the copper metal pattern.

Furthermore, according to the present invention, there can be provided a liquid composition capable of forming a copper metal film or a copper metal pattern, which can be formed by printing and has satisfactory substrate adhesiveness, low volume resistivity and satisfactory deep-part metal properties.

BEST MODE FOR CARRYING OUT THE INVENTION

The copper metal film of the present invention is obtained by treating a copper-based particle deposition layer which contains both copper oxides and a metallic transition metal or alloy, or a transition metal complex containing a metal element, with gaseous formic acid and/or formaldehyde heated to 120° C. or higher.

Hereinafter, the copper metal film of the present invention and a method for producing the copper metal film, and a conductor wiring, a bump, a heat conduction path, and a bonding material, all of which use the copper metal film, will be described respectively in mixture.

The copper metal film of the present invention has a copper metal structure having a thickness of 1 μm or larger or a dense copper film, which is not obtained by conventional reduction/sintering of copper-based nanoparticles, and consequently has low resistance and high adhesiveness. First, the principle of the copper metal film will be explained.

Figure 1:
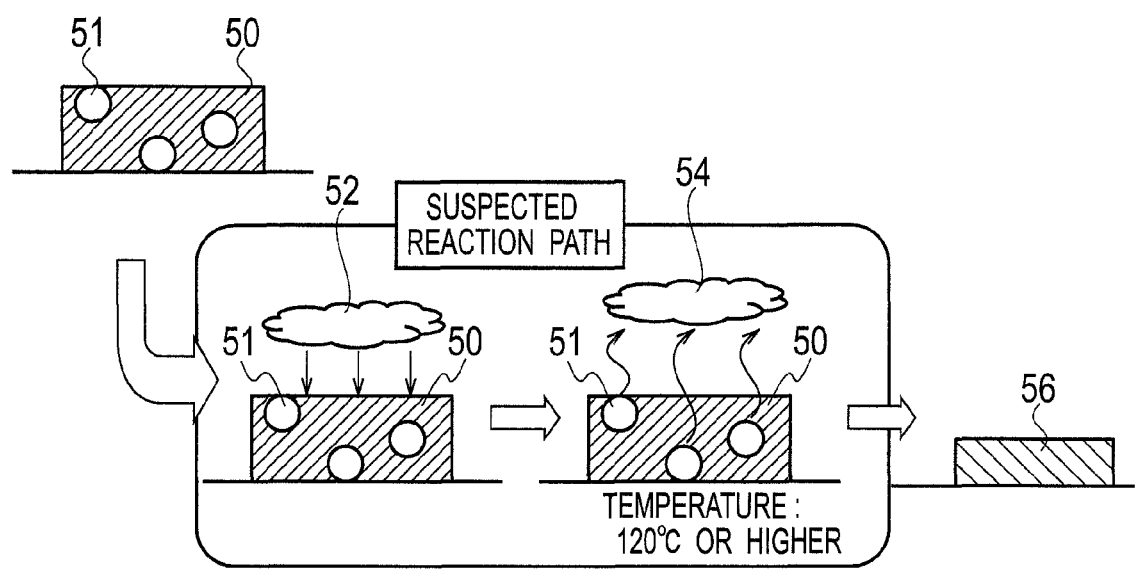
FIG. 1 is a schematic diagram conceptually showing the process of the production of the copper metal film of the present invention.

FIG. 1 conceptually shows the process covering from the treatment of the copper-based particle deposition layer of the present invention with formic acid gas to the production of a copper metal film. In FIG. 1, Reference Numeral 50 represents a copper-based particle deposition layer; Reference Numeral 51 represents a metallic transition metal or alloy, or a transition metal complex containing a metal element; Reference Numeral 52 represents formic acid gas; Reference Numeral 54 represents water and carbon dioxide produced as copper formate is decomposed; and Reference Numeral 56 represents a copper metal film. As shown in FIG. 1, copper oxide in the copper-based particle deposition layer 50 reacts with the formic acid gas 52 and produces copper formate. The copper formate thus produced sublimes and diffuses as a gas, but at a temperature of 120° C. or higher, copper formate is thermally decomposed into copper metal, water and carbon dioxide. Furthermore, in the decomposition of copper formate, when a metallic transition metal or alloy, or a transition metal complex containing a metal element is brought into contact with copper formate that has diffused as a gas, or when adjacent copper oxide turns into copper formate, copper formate is rapidly decomposed into copper metal, water and carbon dioxide. This can be speculated to be because the metallic transition metal or alloy, or the transition metal complex containing a metal element has a catalytic action that decomposes copper formate. This catalytic action increases the rate of conversion of the copper oxide in the copper-based particle deposition layer into copper metal, and at the same time, and at the same time, decreases the amount of copper formate that diffuses outside the copper-based particle deposition layer, and thereby, the precipitation of copper in areas other than the copper-based particle deposition layer can be almost eliminated. In this method, the sublimed copper formate can move a relatively long distance, and depending on the proportions of the metal component and the copper oxide component, copper derived from the copper oxide fill in between the particles. A copper film formed in this manner acquires a copper metal structure having a thickness of 1 μm or more or a dense structure, and exhibits properties close to those of bulk copper. Meanwhile, even in the case of treating with formaldehyde, formic acid is produced as a result of oxidation, and therefore, the argument on the formic acid as described above is applicable.

On the contrary, in the traditional reduction/sintering of copper-based nanoparticles at 200° C. or lower, only those copper atoms at the particle surfaces, which are in a high energy state, fuse and thereby undergo necking under the action of the surface energy, and the gaps between the particles remain without change. Thus, there are limitations to lower the resistance.

Furthermore, when a particle deposition layer formed of copper oxides only is subjected to the formic acid gas treatment according to the present invention, precipitation of copper metal to areas other than the applied copper oxide particle deposition layer occurs. Thus, patterning of copper metal is not achieved, and the copper metal film thus produced also has thickness unevenness.

Hereinafter, the various constituent elements of the present invention will be described.

[Copper-Based Particle Deposition Layer]

The copper-based particle deposition layer is a layer formed by including both copper oxides and a metallic transition metal or alloy, or a transition metal complex containing a metal element, and according to the present invention, the copper-based particle deposition layer is a layer formed before the treatment with formic acid and/or formaldehyde. The metallic transition metal or alloy, or the transition metal complex containing a metal element can be considered as a metal component having catalytic activity for the decomposition of copper formate, as described above. From this, the "metallic transition metal or alloy, or transition metal complex containing a metal element" in the following descriptions may be collectively referred to as "catalytically active metal component."

(Copper Oxides)

The copper oxide component includes cuprous oxide and/or cupric oxide, and in the copper-based particle deposition layer, there are an embodiment of using the copper oxide component as particles containing the copper oxides as a component (hereinafter, referred to as copper oxide particles), and an embodiment of using the copper oxide component as particles in which the surface of the catalytically active metal is coated with copper oxides, that is, particles having a core/shell structure in which the core part is formed of a catalytically active metal, and the shell part is formed of copper oxides (hereinafter, referred to as "core/shell particles").

(Metallic Transition Metal or Alloy, or Transition Metal Complex Containing Metal Element)

As the catalytically active metal component, that is, the metallic transition metal or alloy, or the transition metal complex containing a metal element, specifically a metal selected from the group consisting of Cu, Pd, Pt, Ni, Ag, Au and Rh; an alloy containing these metals; and a transition metal complex containing these metal elements can be used. The relevant catalytically active metal component functions as a catalyst for the decomposition of copper formate and the consequent precipitation of copper metal, so that the catalytically active metal component decomposes and reduces copper formate that has been produced through a formic acid treatment of copper oxides, and precipitates out elemental copper that has been produced by reduction, on the surface as a metal. Meanwhile, in the case of using the transition metal complex, when the transition metal complex is decomposed by heat and/or the action of formic acid before the formic acid treatment or in the early stage of the formic acid treatment, the catalytically active metal component may be produced by the decomposition of copper formate, or the transition metal complex itself may work as a catalyst for the decomposition of copper formate.

Examples of the transition metal complex include complexes which have a metal element selected from the group consisting of Cu, Pd, Pt, Ni, Ag, Au and Rh as a core metal, and have oxygen, a carboxylic acid, an alkoxide, water, an ether, ammonia, an amine, an amide, a nitrile, cyan, carbonic acid, carbon monoxide, a trivalent compound, nitrogen monoxide, isocyanide, an alkene, an aromatic ring, a halogen, nitric acid, or the like as a ligand. Specific examples include copper(I) formate, copper(II) formate, copper(I) acetate, copper(II) acetate, copper(I) cyanide, copper(II) oleate, copper(II) amine complexes, copper thiocyanide, palladium chloride, palladium acetate, dichlorobis(benzonitrile)palladium, dichlorobis(triphenylphosphine)palladium, palladium acetylacetonate, dichloroethylenediamine palladium, platinum acetate, chloroplatinic acid, platinum chloride, dichloroethylenediamine platinum, nickel carbonate, nickel amine complexes, nickel acetate, nickel formate, bromotriphenylphosphine silver, iodotriphenylphosphine silver, silver acetate, silver nitrate, silver oxide, gold oxide, gold cyanide, chlorotris(triphenylphosphine) rhodium(I), rhodium norbornadiene chloride, rhodium chloride, and the like.

According to the present invention, in regard to the catalytically active metal component, there are available an embodiment of using the metal component in the form of particles, an embodiment of using the metal component after forming a film, and an embodiment of mixing the metal component as a solution of a transition metal complex into a printing ink. The details of the various embodiments will be described below.

Figure 2:
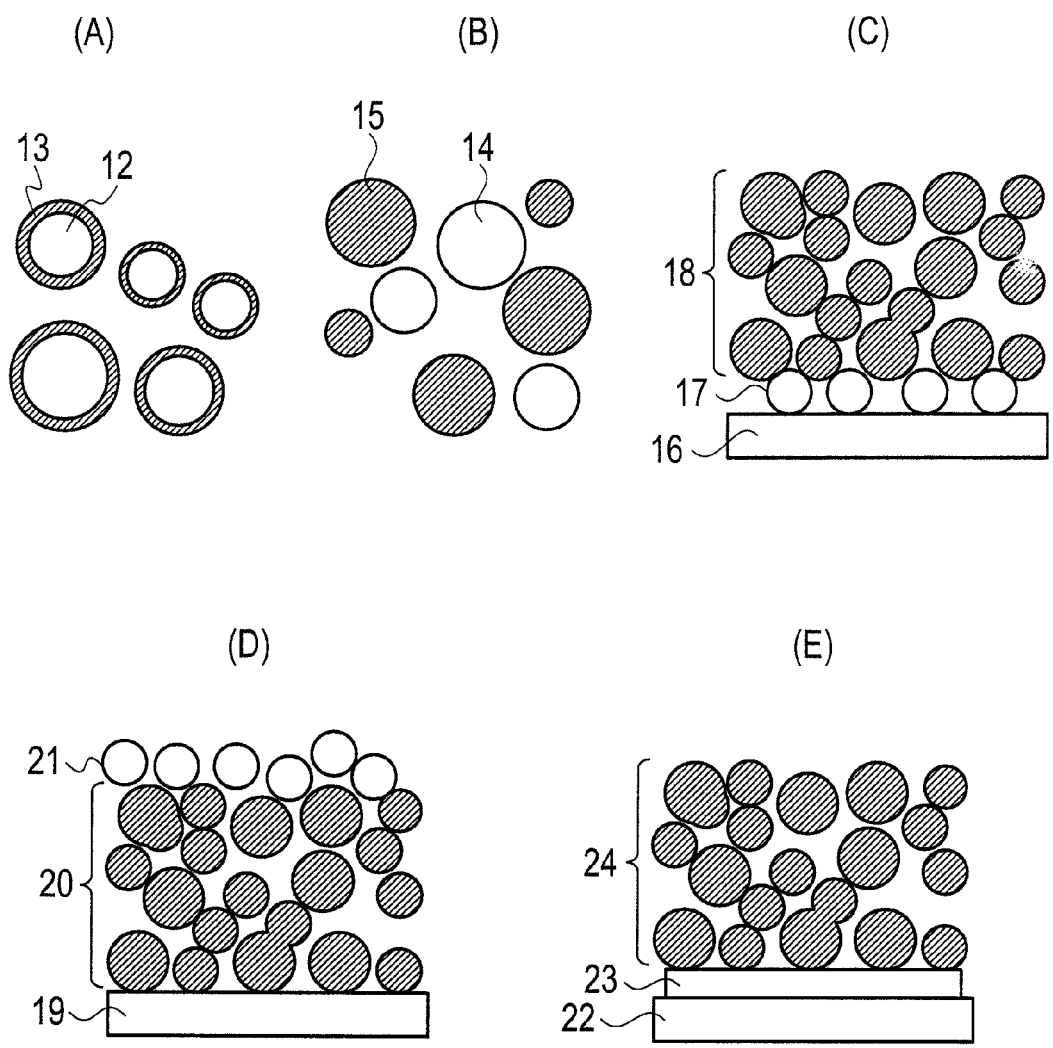
FIG. 2 is a schematic diagram showing the constitution of copper oxide and the catalyst active metal component.

The copper oxides and the catalytically active metal component described above in the copper-based particle deposition layer can be constituted as shown in FIG. 2. Specifically, (a) an embodiment in which copper oxides and a catalytically active metal component are present in the state of a particle having a core/shell structure in which the core part is formed of the catalytically active metal and the shell part is formed of the copper oxides; that is, an embodiment in which, as shown in FIG. 2(A), particles having a copper oxide component 13 present in the surroundings of a catalytically active metal component 12. More specifically, particles in which the surfaces are positively modified to thereby provide a copper oxide shell, or in which copper oxides are provided in the surroundings of catalytically active metal particles using a particle compositization technology, and particles having an oxide film formed as a result of unintentional oxidation of the surface can be used;

(b) an embodiment in which a particle mixture prepared by mixing, at an arbitrary ratio, particles containing a catalytically active metal component and particles containing copper oxides as a component, is deposited into a layer; that is, an embodiment in which, as shown in FIG. 2(B), particles 14 containing the catalytically active metal component and particles 15 containing the copper oxide component are mixed and formed into a layer. As the particles containing the catalytically active metal component, particles of a metal or alloy having catalytic activity and particles of a transition metal complex containing a metal element having activity can be used;

(c) an embodiment in which layers are formed by depositing one or more layers containing copper oxide particles on a layer formed by depositing particles containing a catalytically active metal component, with the layers being in contact; that is, an embodiment in which, as shown in FIG. 2(C), a particle layer 17 formed of a catalytically active metal component is further provided on a substrate 16, and a particle deposition layer 18 formed of a copper oxide component is provided thereof. Meanwhile, according to the present embodiment, the particle layer 17 and eth particle deposition layer 18 constitute the copper-based particle deposition layer;

(d) an embodiment in which layers are formed by depositing particles containing a catalytically active metal component on a layer formed by depositing one or more layers containing particles formed of copper oxides, the layers being in contact with each other; that is, an embodiment in which, as shown in FIG. 2(D), a deposition layer 20 formed of particles formed of a copper oxide component is provided on a substrate 19, and a particle layer 21 formed of a catalytically active metal component is provided thereon. More specifically, a layer containing particles formed of copper oxides can be formed, subsequently particles containing a catalytically active metal component are attached thereon by printing, coating or spraying. In addition to that, a portion of a layer containing particles formed of copper oxides is converted into copper metal through a reduction treatment, and thereby, a particle layer formed of the catalytically active metal component can be produced. Meanwhile, according to the present embodiment, the deposition layer 20 and the particle layer 21 constitute the copper-based particle deposition layer; and (e) an embodiment in which layers are formed by depositing one or more layers containing particles formed of copper oxides, on a film containing a catalytically active metal component; that is, an embodiment in which, as shown in FIG. 2(E), a film 23 of a catalytically active metal component is provided on a substrate 22, and a particle deposition layer 24 formed of a copper oxide component is provided thereon. According to this embodiment, the film 23 and the particle deposition layer 24 constitute the copper-based particle deposition layer.

Furthermore, constitutions combining the respective embodiments of items (a), (b), (c) and (d) may also be used. An example may be an embodiment of combining (a) and (b) (referred to as "embodiment of (f)"), that is, an embodiment in which a particle mixture prepared by mixing particles formed of a catalytically active metal component, particles having a core/shell structure in which the core part is formed of a catalytically active metal component and the shell part is formed of copper oxides, and copper oxide particles at an arbitrary ratio, is deposited into a layer.

Hereinafter, the methods for forming a copper-based particle deposition layer in each of the embodiments of (a) to (f) will be explained.

Embodiment of (a)

The copper-based particle deposition layer of the embodiment of item (a) can be formed by preparing a dispersion liquid containing particles having a core/shell structure which is obtainable as will be described below, applying the dispersion liquid as a coating liquid on a substrate, and drying the dispersion liquid.

~Particles Having Core/Shell Structure~

The particles having a core/shell structure in which the core part is formed of a catalytically active metal component and the shell part is formed of copper oxides, can be produced by compositization of particles formed of the catalytically active metal component and copper oxide particles, by precipitating out copper oxides onto the catalytically active metal particles, by precipitating copper onto the catalytically active metal particles, and then oxidizing the copper layer, or by producing copper metal particles, and then deoxidizing the surfaces of the copper metal particles to form a shell of copper oxides.

Particularly, when the catalytically active metal of the core part is copper, that is, when copper is included in both the core part and the shell part, the particles having a core/shell structure can be produced by, for example, introducing a raw material copper compound into a plasma flame in an inert gas, and rapidly cooling the raw material copper compound with an inert gas for cooling.

Meanwhile, the particles having a core/shell structure used in the present invention may also be coated with a surface treating agent for the purpose of enhancing dispersibility, dispersion stability, and the oxidation resistance of the metallic transition metal or alloy.

The particles having a core/shell structure used in the present invention preferably have a number average particle size of the primary particles of 1 to 1,000 nm, more preferably 1 to 500 nm, and more preferably 10 to 100 nm.

The concentration of the particles having a core/shell structure in the dispersion liquid is mainly limited by the viscosity at which the dispersion liquid can be used by a coating or printing technique, and by dispersibility, and the concentration is preferably set to 5% to 80% by weight, more preferably 10% to 60% by weight, and even more preferably 10% to 50% by weight.

Dispersion can be carried out using an ultrasonic dispersing machine; a medium dispersing machine such as a bead mill; a cavitation stirrer such as a homomixer or a Silverson stirrer; a counter collision method such as an Ultimaizer; an ultrathin film high-speed rotary dispersing machine such as Crea SS5; a rotary and revolutionary mixer, or the like.

Embodiment of (b)

The copper-based particle deposition layer of the embodiment of item (b) can be formed by preparing a dispersion liquid by mixing particles containing as a component a metallic transition metal or alloy, or a transition metal complex containing transition metal atoms, with particles containing copper oxides as a component, at an arbitrary ratio, applying the dispersion liquid as a coating liquid on a substrate, and drying the dispersion liquid.

The catalytic activity of particles formed of a catalytically active metal component varies with the surface area. Accordingly, the surface area of particles formed of a catalytically active metal component with respect to particles containing copper oxides as a component (X) is such that the surface area of the particles formed of the catalytically active metal component is preferably 0.4 $m^2$ or larger, and more preferably 0.8 $m^2$ or larger, per gram of the weight of copper oxides.

The catalytically active metal component is such that when used in the form of particles as in the present embodiment, it is preferable that the surface area having catalytic activity be larger. Thus, the number average primary particle size is preferably adjusted to 1 to 1000 nm, and more preferably 1 to 100 nm.

In addition, the particles containing copper oxides as a component, and the particles containing a metallic transition metal or alloy having catalytic activity toward the decomposition of copper formate, or a transition metal complex containing transition metal atoms as a component, that are used in the present invention, may be coated with a surface treating agent for the purpose of enhancing dispersibility, dispersion stability, and oxidation resistance of a metallic transition metal or alloy.

Embodiment of (c)

In order to form the copper-based particle deposition layer of the embodiment of item (c), first, a layer produced by depositing particles formed of a catalytically active metal component is formed, and examples of the technique for forming this layer include coating, spraying or printing of a particle dispersion liquid containing the catalytically active metal component, an acidic Pd seeder treatment, an alkali Pd seeder treatment, electrostatic adsorption of metal particles, and the like.

In the case of forming a layer by applying a particle dispersion liquid containing a component having catalytic activity toward the decomposition of copper formate, the concentration of the particles formed of a catalytically active metal component in the dispersion liquid is preferably adjusted to 0.01% to 50% by weight, more preferably 0.05% to 10% by weight, and even more preferably 0.5% to 5% by weight.

As the dispersion medium of the dispersion liquid, the number average particle size of the particles containing a component having catalytic activity toward the decomposition of copper formate is the same as the value shown in relation to the item (b). Furthermore, the layer thickness (after drying) of the deposition layer is preferably adjusted to 1 to 500 nm.

Subsequently, on the deposition layer thus formed by the particles containing a component having catalytic activity toward the decomposition of copper formate, one or more deposition layers obtainable by applying a dispersion in which particles of copper oxides are dispersed as a coating liquid and drying the dispersion liquid, are deposited. In order to form two or more layers of the relevant deposition layer, application and drying of the coating liquid may be carried out repeatedly. The relevant deposition layer is preferably laminated in 1 to 10 layers.

The concentration of the copper oxide particles in the dispersion liquid is mainly limited by the viscosity at which the dispersion liquid can be used by a coating or printing technique, and by dispersibility, and the concentration is preferably adjusted to 5% to 80% by weight, more preferably 10% to 60% by weight, and even more preferably 10% to 50% by weight. The dispersion medium of the dispersion liquid is the same as the dispersion medium described in relation to the item (a).

Embodiment of (d)

In order to form the copper-based particle deposition layer of the embodiment of (d), first, one or more deposition layers that are obtainable by applying a dispersion liquid in which particles of copper oxides are dispersed as a coating liquid, and drying the dispersion liquid, as shown in connection with the item (c) described above, are laminated, and a layer having a catalytically active metal component is formed thereon. In regard to the technique for forming the layer having a catalytically active metal component, in addition to the technique described above in the item (c), a technique of reducing the top (a portion) of the copper-based particle deposition layer, and thereby converting the component to a catalytically active metal component, that is, copper metal that is a metallic transition metal, can also be realized.

As the technique for reducing the top of the copper oxide particle deposition layer, use can be made of (1) a hot wire method atomic hydrogen treatment to which hydrogen or ammonia gas is introduced, (2) a surface wave plasma treatment, (3) an RF plasma treatment, (4) a heating treatment in hydrogen, (5) a treatment using a treatment liquid which contains, in a single solution, both an agent which ionizes or complexates copper oxides, and a reducing agent which reduces copper ions or a copper complex to copper metal, but does not contain copper ions, and (6) an atomic hydrogen treatment through ultraviolet irradiation.

The dispersion liquid in which particles of copper oxides are dispersed is the same as the dispersion liquid described in the item (c).

The copper-based particle deposition layer of the embodiment of (f) can be formed by preparing a dispersion liquid by mixing the particles containing a catalytically active metal as a component, particles containing copper oxides as a component, and core/shell particles at an arbitrary ratio, applying the dispersion liquid as a coating liquid on a substrate, and drying the dispersion liquid. The dispersion medium of the relevant dispersion liquid is the same as the dispersion medium described in the item (a).

The mixing ratio (x:y) of the particles containing a catalytically active metal as a component (x) and particles containing copper oxides as a component (y) is preferably 1:1 to 1:100,000, more preferably 1:1 to 1:100,000, and even more preferably 1:10 to 1:10,000. The mixing ratio (y:z) of the particles containing copper oxides as a component (y) and the core/shell particles (z) is preferably 100:1 to 1:100, more preferably 50:1 to 1:10, and even more preferably 20:1 to 1:1.

(Substrate)

The copper conductor film of the present invention is preferably formed on a substrate, and as the material of the substrate, specifically, films, sheets and plates formed from polyimide, polyethylene naphthalate, polyether sulfone, polyethylene terephthalate, polyamideimide, polyether ether ketone, polycarbonate, a liquid crystal polymer, an epoxy resin, a phenolic resin, a cyanate ester resin, a fiber-reinforced resin, an inorganic particle-filled resin, polyolefin, polyamide, polyphenylene sulfide, polypropylene, a crosslinked polyvinyl resin, glass, ceramics and the like may be used.

Meanwhile, in the present invention, since sintering at a relatively low temperature is made possible, there are less limitations on the substrate to be used, such that a substrate having low heat resistance can be used, or the like.

(Formic Acid and/or Formaldehyde Gas Treatment)

[Formic Acid and/or Formaldehyde Gas]

As the treatment gas, formic acid and/or formaldehyde can be used. Formaldehyde is converted to formic acid by being oxidized, and exhibits the same action as that of formic acid. Similarly, since methanol is also converted to formaldehyde and then to formic acid when oxidized, it is speculated that methanol can also be used similarly to formaldehyde.

It is preferable to heat liquid formic acid to a temperature of 100° C. or higher, which is the boiling point of formic acid, or to convert liquid formic acid to a gaseous form by reducing pressure, and then to lead the gas to a substance to be treated. Furthermore, when liquid formic acid adheres to the substance to be treated, the temperature of the substance to be treated falls to 100° C., which is the boiling point of formic acid, conductorization does not proceed, and a portion of copper oxides dissolves out into copper formate so that loss of a copper(I or II) element-containing ink or precipitation of copper to areas outside the applied site. Therefore, it is preferable not to join liquid formic acid with the substance to be treated.

Gas components other than formic acid and/or formaldehyde are not particularly limited as long as they do not react with formic acid and/or formaldehyde, and the gas components may not include gas components other than formic acid and/or formaldehyde gas. When oxygen is contained, since there is a risk of explosion when oxygen is heated with formic acid, it is preferable that the ratio of oxygen and formic acid gas and/or formaldehyde be out of the range of explosion. In the case of formic acid, the ratio when mixed with air is equal to or less than 18 vol % or equal to or greater than 51 vol %. In the case of formaldehyde, the ratio when mixed with air is equal to or less than 7 vol % or equal to or greater than 73 vol %.

[Treatment Condition]

The temperature of the treatment using formic acid and/or formaldehyde gas is set to 120° C. or higher, which is a temperature at which copper metal is precipitated out as a result of the treatment with formic acid and/or formaldehyde gas, and is preferably 140° C. or higher from the viewpoint of reaction speed. The upper limit of the treatment temperature is defined by the heat resistant temperature of the substrate.

The treatment pressure is not particularly limited, and any of the atmospheric pressure condition, a reduced pressure condition and a pressurized condition may be used.

(Post-Treatment of Formic Acid and/or Formaldehyde Gas Treatment)

If formic acid that has been used in the treatment remains behind on the surface of copper metal, the formic acid causes corrosion of copper metal. Therefore, a step of removing formic acid after the formic acid and/or formaldehyde gas treatment may be provided. As the method for removing formic acid and/or formaldehyde, heating under an oxygen-free gas stream, heating under reduced pressure, or washing with water can be used.

As the heating under an oxygen-free gas stream, heating with a supply of an oxygen-free gas which does not contain formic acid and/or formaldehyde gas in the formic acid and/or formaldehyde gas treatment tank, or heating with an oxygen-free gas oven or a heat source under an oxygen-free gas stream can be used. As the heating under reduced pressure, when the formic acid and/or formaldehyde gas treatment is carried out in a reduced pressure tank, heating under reduced pressure with stopped supply of formic acid and/or formaldehyde gas, or a reduced pressure oven can be used.

<Patterned Copper Metal Pattern>

The patterned copper metal pattern of the present invention is characterized in that a copper-based particle deposition layer containing both copper oxides and a metallic transition metal or alloy, or a transition metal complex containing a metal element, is patterned by printing, and the copper metal pattern is obtained by treating the patterned layer with a treatment method of bringing the patterned layer into contact with gaseous formic acid and/or formaldehyde heated to 120° C. or higher.

That is, the patterned copper metal pattern of the present invention is obtained by forming, during the formation of the copper-based particle deposition layer explained in connection with the copper metal film of the present invention, a layer which serves a wiring pattern by printing on a substrate a coating liquid for copper-based particle deposition layer formation in the form of the wiring pattern, and treating the wiring pattern using formic acid gas and heat to metallize wiring pattern.

The printing method used in the patterning of the copper-based particle deposition layer may be any technique of adhering the copper-based particle deposition layer at an arbitrary site, and examples of such a technique that can be used include inkjet printing, super inkjet printing, screen printing, transfer printing, offset printing and jet printing methods, a dispenser, a jet dispenser, a needle dispenser, a comma coater, a slit coater, a die coater, a gravure coater, relief printing, intaglio printing, gravure printing, soft lithography, dip-pen lithography, a particle deposition method, a spray coater, a spin coater, a dip coater, and electrodeposition. Among them, any one selected from the group consisting of inkjet printing, super inkjet printing, screen printing, transfer printing, offset printing and jet printing methods, a dispenser, a needle dispenser, a comma coater, a slit coater, a die coater, and a gravure coater is preferred.

After forming the copper-based particle deposition layer pattern as described above, the pattern is treated in the same manner as in the production method of the present invention described above. That is, the pattern is dried as necessary, and then the copper-based particle deposition layer pattern thus formed is subjected to a treatment with formic acid gas and heat as described above. Then, similarly to the method for producing a copper metal film described above, copper metal in the copper-based particle deposition layer is precipitated out to form a continuous layer of copper metal. Furthermore, since copper metal is also precipitated out even between the particles or in the deep-parts of the layer, a copper metal pattern of dense copper is obtained.

Therefore, a conductor wiring, a copper metal bump, a heat conduction path and a bonding material that all use the copper metal pattern of the present invention have excellent substrate adhesiveness and can be formed by printing with low volume resistivity, without damaging the substrate. Here, the bonding material is a material which mechanically adheres metal-to-metal surfaces, such as an adhesive or solder.

<Liquid Composition>

The liquid composition of the present invention contains copper oxides, a metallic transition metal or alloy, or a transition metal complex containing a metal element, and a solvent having a vapor pressure at 25° C. of less than $1.34 \times 10^3$ Pa, and is characterized in that dispersion is achieved to have an average dispersion particle size of 500 nm or less and a maximum dispersion particle size of 2 μm or less, and the content of the copper oxides is 1 to 80 parts by volume relative to 100 parts by volume of the total amount of the copper oxides, the metallic transition metal or alloy, or the transition metal complex containing a metal element, and the solvent.

The liquid composition of the present invention is suitable for the coating liquid used in the formation of the copper-based particle deposition film formed at the time of the production of the copper metal pattern of the present invention described above. Therefore, for the copper oxides and the metallic transition metal or alloy, or the transition metal complex containing a metal element in the liquid composition of the present invention, the explanation on the copper metal film of the present invention as described above directly applies.

(Solvent)

As the solvent, a solvent having a vapor pressure at 25° C. of less than $1.34 \times 10^3$ Pa, and preferably less than $1.0 \times 10^3$ Pa·s, is used.

Examples of such a solvent include those shown below. That is, examples include aliphatic hydrocarbon-based solvents such as nonane, decane, dodecane, and tetradecane; aromatic hydrocarbon-based solvents such as ethylbenzene, anisole, mesitylene, naphthalene, cyclohexylbenzene, diethylbenzene, phenylacetonitrile, phenylcyclohexane, benzonitrile, and mesitylene; ester-based solvents such as isobutyl acetate, methyl propionate, ethyl propionate, γ-butyrolactone, glycol sulfite, ethyl lactate, and ethyl lactate; alcohol-based solvents such as 1-butanol, cyclohexanol, α-terpineol, and glycerin; ketone-based solvents such as cyclohexanone, 2-hexanone, 2-heptanone, 2-octanone, 1,3-dioxolan-2-one, and 1,5,5-trimethylcyclohexen-3-one; alkylene glycol-based solvents such as diethylene glycol ethyl ether, diethylene glycol diethyl ether, propylene glycol monomethyl ether, propylene glycol monoethyl ether, propylene glycol monopropyl ether, propylene glycol monobutyl ether, propylene glycol monomethyl ether acetate, diethylene glycol ethyl ether acetate, diethylene glycol propyl ether acetate, diethylene glycol isopropyl ether acetate, diethylene glycol butyl ether acetate, diethylene glycol t-butyl ether acetate, triethylene glycol methyl ether acetate, triethylene glycol ethyl ether acetate, triethylene glycol propyl ether acetate, triethylene glycol isopropyl ether acetate, triethylene glycol butyl ether acetate, triethylene glycol t-butyl ether acetate, dipropylene glycol dimethyl ether, and dipropylene glycol monobutyl ether; ether-based solvents such as dihexyl ether, butyl phenyl ether, pentyl phenyl ether, methoxytoluene, and benzyl ethyl ether; carbonate-based solvents such as propylene carbonate, and ethylene carbonate; amide-based solvents such as N,N-dimethylformamide, N,N-dimethylacetamide, and N-methylpyrrolidone; and nitrile-based solvents such as malononitrile. Among them, γ-butyrolactone, N-methylpyrrolidone, glycol sulfite, and propylene carbonate are preferred. These solvents can be used singly or in combination of two or more kinds.

Furthermore, in the liquid composition of the present invention, the components are dispersed such that the average dispersion particle size is 500 nm or less, and the maximum dispersion particle size is 2 μm or less. If the average dispersion particle size is greater than 500 nm, the printing properties or the stability for resistance manifestation are not sufficient. For example, when the liquid composition is discharged by an inkjet printing method, clogging of the inkjet head nozzle or the like occurs, and printing cannot be stably achieved. Furthermore, when the liquid composition is used in an offset printing method or the like, blurring occurs in the print products. In order to further improve the printing properties or the stability of resistance manifestation, the average dispersion particle size of the particles is preferably 300 nm or less. It is preferable that this average dispersion particle size be smaller, but usually, the lower limit is about 5 nm. Furthermore, from the same viewpoint, the maximum dispersion particle size of the particles is preferably 2 µm or less, and more preferably 1 µm or less.

Here, the average dispersion particle size and the maximum dispersion particle size are measured by a photon correlation method on the basis of the dynamic light scattering method based on the Brownian motion of particles. The measurement of the average dispersion particle size and the maximum dispersion particle size can be carried out, for example, using "N5 Submicron Particle Size Analyzer" (trade name) manufactured by Beckman-Coulter, Inc.

Furthermore, in the liquid composition of the present invention, the content of the copper oxides is 1 to 80 parts by volume, and preferably 10 to 60 parts by volume, relative to 100 parts by volume of the total amount of the copper oxides, the metallic transition metal or alloy, or the transition metal complex containing a metal element, and the solvent. If the content is larger than 80 parts by volume, the viscosity of the liquid composition increases, and there occurs a problem that character printability decreases.

The liquid composition of the present invention constitutes a solution of the complex containing a metal element in the solvent, and the content of the complex is such that when the weight of the particles containing copper oxides is taken as 100, the weight of the metal atoms in the complex is preferably 1 to 100, and more preferably 2 to 50. When this weight range is satisfied, a sufficient amount of catalytic metal can be produced, and the adverse effects of the decomposition gas or residue of the complex can be minimized.

In the liquid composition of the present invention, the metal, the alloy containing the metal, or the complex containing the metal element is in a particulate form, and the particles are dispersed such that the maximum dispersion particle size is 2 µm or less. The liquid dispersion preferably contains the particles such that the surface area of the particles is 0.4 m$^2$ or more, more preferably 0.8 m$^2$ or more, per gram of the weight of the particles containing copper oxides. Furthermore, the upper limit of the relevant value is 250 m$^2$. when the range of the surface area is satisfied, both the decomposition of copper formate and the diffusion of copper formate satisfactorily proceed.

The liquid composition of the present invention is preferably such that the dynamic viscosity at 25° C. is 100 mPa·s or less, and more preferably 50 mPa·s or less. When the viscosity range is satisfied, satisfactory inkjet suitability is obtained. Meanwhile, the "dynamic viscosity at 25° C." is, in other words, the shear viscosity at a shear rate of $10^1$ s$^{-1}$ at a measurement temperature of 25° C.

EXAMPLES

Hereinafter, the present invention will be specifically described by way of Examples, but the present invention is not intended to be limited to these.

Example 1

Preparation of Copper Ink

Liquid Composition

A copper ink was prepared by weighing 36 g of CuO nanoparticles (average particle size 70 nm, C.I. Kasei Co., Ltd.) and 4 g of Cu nanoparticles with naturally oxidized surface (BET specific surface area 8 m$^2$/g, Nissei Engineering, Inc.) (CuO particles:Cu particles=90:10) in a Polybottle, adding γ-butyrolactone (Wako Pure Chemical Industries, Ltd.) so that the solids content would be 40 mass %, tightly stopping the bottle, subsequently mixing the content by shaking, and treating the mixture with an ultrasonic homogenizer (US-600, manufactured by Nippon Seiki Co., Ltd.) at 19.6 kHz and 600 W for 5 minutes. Since CuO particles:Cu particles=90:10, the surface area of the Cu particles with respect to 1 g of CuO is 0.8 m$^2$.

In addition, the dynamic viscosity (Anton Paar GmbH, viscoelasticity analyzer MCR301) at 25° C. was 98 mPa·s, the surface tension (fully automated surface tensiometer CBVP-Z, manufactured by Kyowa Interface Science Co., Ltd.) was 49 mN/m, the average dispersion particle size (laser scattering type particle size distribution analyzer, LS13 320 manufactured by Beckman-Coulter, Inc.) was 490 nm, and the maximum dispersion particle size was 1,830 nm.

(Production of Copper Ink-Applied Sample)

The copper foil of a copper foil-attached epoxy substrate (E-679F, manufactured by Hitachi Chemical Co., Ltd.) was etched with an aqueous solution of ammonium peroxodisulfate (manufactured by Junsei Chemical Co., Ltd.), and the substrate was washed with water and dried. The copper ink was dropped on the copper foil surface of the substrate, and the copper ink was applied using a baker applicator (YBA model, manufactured by Yoshimitsu Seiki K.K.) with the gap adjusted to 100 µm. Thereafter, the substrate was placed on a hot plate heated to 100° C. and was dried for 15 minutes. Thus, a copper ink-applied sample having a copper-based particle deposition layer formed was obtained.

(Formic Acid Gas Treatment)

Formic acid was placed in a gas wash bottle, and nitrogen bubbling was carried out, the bottle was heated in an oil bath at 110° C. Thus, the bottle was used as a formic acid gas generator. Sea sand was spread on the bottom of a separable flask having a flat bottom, which had been heated in an oil bath, and then the sample was placed on the sea sand. A chromel-alumel thermocouple was mounted on the surface of this sample, and the sample temperature was measured. While nitrogen was allowed to flow into the separable flask in which this sample was placed, the flask was heated in an oil bath at 200° C. to make the temperature of the sample constant (166° C.), and then a nitrogen gas containing the formic acid gas generated by the formic acid gas generator was allowed to pass through this separable flask to treat the copper-based particle deposition layer for 20 minutes. At that time, it was recognized that the entirety of the black-colored sample changed to copper color in 3 minutes after the introduction of formic acid gas. After the treatment, the formic acid gas generator was separated, and while nitrogen was allowed to flow through, the separable flask was allowed to cool. After the sample was brought to 50° C. or lower, the sample was taken out in air. In this manner, a copper metal film was produced.

(Characteristics Evaluation)

The sample colors on the front surface side and the glass substrate side (deep-part side) were checked by visual inspection. As a result, the front surface had dull copper color, and the back surface had copper color with metallic gloss.

Figure 3:
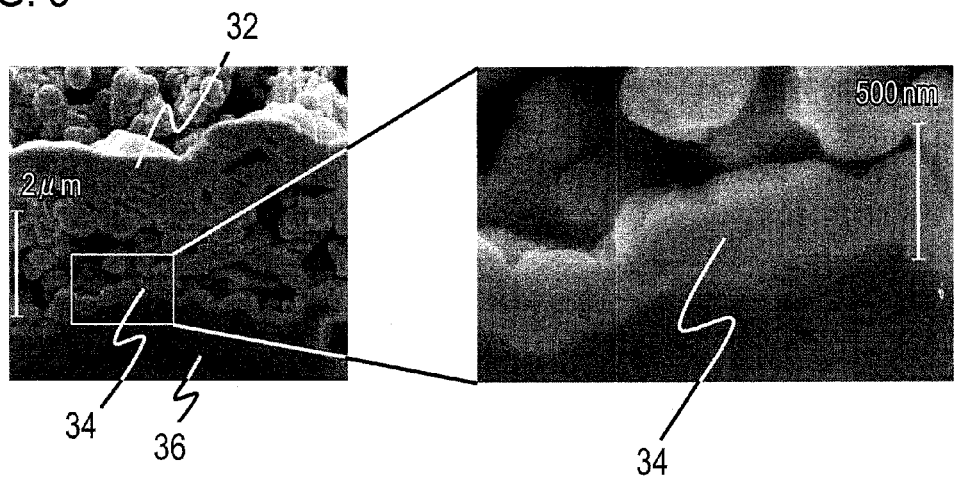
FIG. 3 is drawing-substitute photographs showing SEM images (inclination 45°) of the FIB processed cross-section of a copper metal film produced in Example 1.

For the cross-section shape of the sample film, a trench processed cross-section was slanted 45° C. in an FIB processing apparatus (FB-2000A, manufactured by Hitachi, Ltd.) and was observed by SEM (XL30, Philips). The SEM-observed images are shown in FIG. 3 as drawing-substitute photographs. In FIG. 3, Reference Numerals 32, 34 and 36 represent an FIB-processed protective layer (tungsten), a formic acid gas-treated CuO ink layer, and an epoxy substrate, respectively.

The film thickness of the sample film was measured from a SEM image of the cross-section described above. The volume resistivity was determined by measuring the surface resistance using a four-probe mode low resistivity meter (Loresta GP, manufactured by Mitsubishi Chemical Corp.), and multiplying the surface resistance by the film thickness, and the volume resistivity was $3.0 \times 10^{-7} \Omega \cdot m$.

Comparative Example 1

Preparation of Copper Ink

A copper ink was prepared by weighing 40 g of CuO nanoparticles (average particle size 70 nm, manufactured by C.I. Kasei Co., Ltd.) in a Polybottle, adding 60 g of γ-butyrolactone (manufactured by Wako Pure Chemical Industries, Ltd.) to 40 mass %, tightly stopping the bottle, mixing the content by shaking, and then treating the mixture with an ultrasonic homogenizer (US-600, manufactured by Nippon Seiki Co., Ltd.) at 19.6 kHz and 600 W for 5 minutes.

(Production of Copper Ink-Applied Sample)

The copper foil of a copper foil-attached epoxy substrate (E-679F, manufactured by Hitachi Chemical Co., Ltd.) was etched with an aqueous solution of ammonium persulfate (manufactured by Junsei Chemical Co., Ltd.), and the substrate was washed with water and dried. The copper ink was dropped on the copper foil surface of the substrate, and the copper ink was applied using a baker applicator with the gap adjusted to 200 μm. Thereafter, the substrate was placed on a hot plate heated to 100° C. and was dried for 20 minutes. Thus, a copper ink-applied sample was obtained.

(Hot Wire Method Atomic Hydrogen Treatment)

The copper ink-printed sample was mounted in a hot wire atomic hydrogen treatment apparatus (manufactured by Universal Systems SE), and the sample was treated for 10 minutes at a hydrogen flow rate of 50 sccm, a pressure in tank of 10 Pa, and a hot wire input power of 500 W. The volume resistance after the treatment was $2.7 \times 10^{-6} \Omega \cdot m$.

Figure 4:
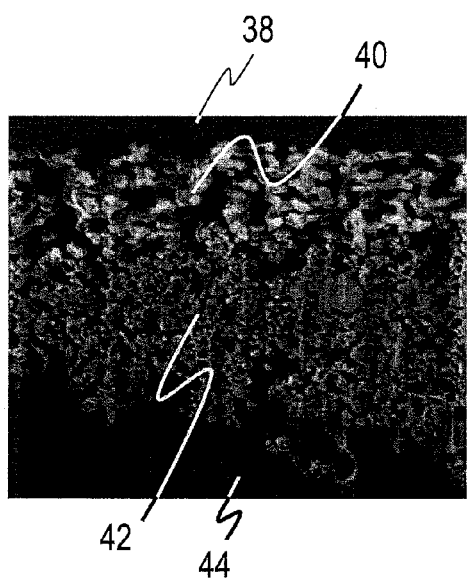
FIG. 4 is a drawing-substitute photograph showing a SEM image (inclination 45°) of the FIB-processed cross-section of a copper metal film produced in Comparative Example 1.

For the cross-section shape of the sample film, a trench processed cross-section was slanted 45° C. in an FIB processing apparatus (FB-2000A, manufactured by Hitachi, Ltd.) and was observed by SEM (XL30, Philips). The SEM-observed image is shown in FIG. 4 as a drawing-substitute photograph. In FIG. 4, Reference Numerals 38, 40, 42 and 44 represent an FIB-processed protective layer (tungsten), a reduced and sintered CuO ink layer, a layer where the particle shape of CuO ink remains, and an epoxy substrate, respectively. From the observation of the cross-section, the layer where sintering proceeded and the shape of CuO particles in the ink was no longer seen, was about 2 μm from the surface. The layer deeper than that had the same morphology as that of the cross-section of the CuO particle deposition layer before the treatment.

Example 2

The processes were carried out in the same manner as in Example 1, except that the oil bath temperature was set to 174° C., and the treatment was carried out at a sample treatment temperature of 152° C. The evaluation results are shown in Table 1.

Example 3

The processes were carried out in the same manner as in Example 1, except that the oil bath temperature was set to 157° C., and the treatment was carried out at a sample treatment temperature of 140° C. The evaluation results are shown in Table 1.

Comparative Example 2

The processes were carried out in the same manner as in Example 1, except that the oil bath temperature was set to 140° C., and the treatment was carried out at a sample treatment temperature of 110° C. The evaluation results are shown in Table 1.

TABLE 1

| | Treatment temperature (° C.) | Film thickness (mm) | Volume resistivity (Ω ? m) | Surface color of sample after treatment |
|---|---|---|---|---|
| Example 1 | 166 | 5 | $3.0 \times 10^{-7}$ | Copper color |
| Example 2 | 152 | 11 | $5.7 \times 10^{-7}$ | Copper color |
| Example 3 | 140 | 5 | $8.5 \times 10^{-7}$ | Brown color |
| Comparative Example 2 | 110 | ND | No conduction | Black color |

Example 4

4.7 g of a copper ink in which copper metal nanoparticles are dispersed with a dispersant (average particle size 3 to 4 nm (catalogue value), Cu1T, manufactured by ULVAC Technologies, Inc.) was dried by evaporating toluene of the dispersion medium by blowing nitrogen gas at room temperature, and then 25.7 g of CuO nanoparticles (average particle size 70 nm, C.I. Kasei Co., Ltd.) and 73 g of γ-butyrolactone (Wako Pure Chemical Industries, Ltd.) (solids content 27 mass %) were added thereto. The mixture was treated with an ultrasonic homogenizer (US-600, manufactured by Nippon Seiki Co., Ltd.) at 19.6 kHz and 600 W for 5 minutes, and was treated with a centrifuge at 1500 rpm for 4 minutes, and coarse particles were removed. Thus, a copper ink was prepared. In addition, the dynamic viscosity (Anton Paar GmbH, viscoelasticity analyzer MCR301) at 25° C. was 10 mPa·s, the average dispersion particle size (laser scattering type particle size distribution analyzer, LS13 320 manufactured by Beckman-Coulter, Inc.) was 190 nm, and the maximum dispersion particle size was 1.046 nm.

The copper ink was applied on a glass preparation using a baker applicator with the gap adjusted to 200 μm, and was left to stand for 2 hours at room temperature. Subsequently, the sample was dried on a hot plate heated to 100° C., and thus a sample having a copper-based particle deposition layer was obtained. The sample was treated with formic acid gas in the same manner as in Example 1. The copper ink-applied sample changed to copper color with metallic gloss, and the surface resistance measured using a four-probe method low resistivity meter was 0.03Ω/□. Furthermore, precipitation of copper to areas outside the applied site was not seen. The film thickness measured from SEM observation of a FIB-processed cross-section was 8 μm. In addition to that, the evaluation results are presented in Table 2.

Example 5

Preparation of Copper Ink

A copper ink was prepared by weighing 27 g of CuO nanoparticles (average particle size 70 nm, C.I. Kasei Co., Ltd.) in a Polybottle, adding 73 g of γ-butyrolactone (Wako Pure Chemical Industries, Ltd.) to 27 mass %, tightly stopping the bottle, mixing the content by shaking, subsequently treating the mixture with an ultrasonic homogenizer (US-600, manufactured by Nippon Seiki Co., Ltd.) at 19.6 kHz and 600 W for 5 minutes, treating the mixture with a centrifuge at 1500 rpm for 4 minutes, and removing coarse particles. The dynamic viscosity (A&D Co., Ltd., small-sized vibration viscometer SV-10) at 25° C. was 8 mPa·s, the surface tension (fully automated surface tensiometer CBVP-Z, manufactured by Kyowa Interface Science Co., Ltd.) was 45 mN/m, the average dispersion particle size (laser scattering type particle size distribution analyzer, manufactured by Beckman-Coulter, Inc.) was 70 nm, the maximum dispersion particle size was 200 nm, and the copper ink could be applied to inkjet printing.
(Production of Copper Ink Printed Sample)

Printing was carried out on a surface having a size of 1 cm×1 cm by dropping the ink on a glass preparation with an inkjet apparatus (MJP printer, manufactured by Microjet Microtechnology Co., Ltd.) in a discharge amount of 90 ng/drop, and thus a copper ink-printed sample was obtained. The external appearance of the copper ink print product was measured with a laser interferometric surface profile analyzer (MM3000, manufactured by Ryoka Systems, Inc.), and the film thickness of the copper ink-printed area was determined from the level difference between the printed area and the glass substrate. The film thickness was 1 μm.
(Platinum Particle Application)

0.01 g of a platinum powder (average particle size: 0.14 to 0.45 μm (catalogue value), Sigma-Aldrich Company), and 0.99 g of methyl isobutyl ketone (Wako Pure Chemical Industries, Ltd.) were mixed, and the mixture was dispersed with an ultrasonic cleaner for 20 minutes. Before precipitation, one droplet of the mixture was dropped on the copper ink-printed area of the copper ink-printed sample, and the dispersion was spread over the entire surface of the copper ink-printed area and then dried. Thus, a copper-based particle deposition layer with applied Pt particles was formed.
(Formic Acid Gas Treatment)

The formic acid gas treatment of the copper-based particle deposition layer with applied Pt particles was carried out in the same manner as in Example 1.
(Characteristic Evaluation)

The volume resistivity was determined by measuring the surface resistance using a four-probe method low resistivity meter (Loresta GP, manufactured by Mitsubishi Chemical Corp.), and multiplying the surface resistance by the film thickness of the copper ink-printed area, 1 μm.

The color of this sample changes to copper color, along with the progress of the reduction from the black color of CuO nanoparticles. This was observed by visual inspection. The deep-part reducibility was determined by observing the back surface of the printed area by visual inspection from the glass substrate side, and the case in which the color changed to copper color was considered to have deep-part reducibility. Copper precipitation to areas other than the applied site was confirmed by visual inspection of the glass substrate part where the copper ink was not printed. If copper metal precipitates out on the glass substrate, color change from dark green color to copper color can be seen.

The results of the above characteristic evaluation are presented in Table 2.

Example 6

The processes were carried out in the same manner as in Example 5, except that a palladium powder (average particle size: 1.0 to 1.5 μm (catalogue value), manufactured by ChemPur GmbH) was used in place of the platinum powder. The evaluation results are presented in Table 2.

Example 7

The processes were carried out in the same manner as in Example 5, except that a silver nanopowder (average particle size <100 nm (catalogue value), manufactured by Sigma-Aldrich Company) was used in place of the platinum powder. The evaluation results are presented in Table 2.

Example 8

The processes were carried out in the same manner as in Example 5, except that a nickel nanopowder (average particle size <100 nm (catalogue value), Sigma-Aldrich Company) was used in place of the platinum powder. The evaluation results are presented in Table 2.

Example 9

The processes were carried out in the same manner as in Example 5, except that a tetrahydrofuran solution of chlorotris(triphenylphosphine) rhodium(I) (Wako Pure Chemical Industries, Ltd.) was used in place of the methyl isobutyl ketone dispersion liquid of platinum powder. The results are presented in Table 2.

Example 10

The processes were carried out in the same manner as in Example 5, except that a saturated γ-butyrolactone solution of copper(II) formate hydrate (Sigma-Aldrich Company) was used in place of the methyl isobutyl ketone dispersion liquid of platinum powder. It was thought that the copper(II) formate hydrate is decomposed when the temperature is increased to the treatment temperature under a nitrogen gas stream, and produces copper metal, and this copper metal serves as a catalyst to produce copper metal only in the copper ink-applied area. In addition to that, the evaluation results are presented in Table 2.

Example 11

Copper metal was obtained by reducing the copper ink-printed film surface with hot wire method atomic hydrogen, instead of applying metal particles to the surface. A copper-based particle deposition layer containing this copper metal as a catalytically active metal component was subjected to formic acid reduction. The details are described below.

(Production of Copper Ink-Printed Sample)

A copper ink-printed sample was produced in the same manner as in Example 5.

(Hot Wire Method Atomic Hydrogen Treatment)

The hot wire method atomic hydrogen treatment was carried out using a hot wire CVD apparatus (manufactured by Universal Systems SE) introduced with hydrogen under the conditions of a hydrogen flow rate of 20 sccm, a pressure in the tank of 0.4 Pa, a tungsten wire input power of 520 W, a tungsten wire temperature of 1560° C. (measured with a radiation thermometer), and a treatment time of 10 minutes. The sample front surface after the hot wire method atomic hydrogen treatment was dark brown in color, and the sample back surface observed from the glass substrate side was black in color. Thus, only the front surface was reduced. The surface resistance was 657Ω/□.

(Formic Acid Gas Treatment)

The copper-based particle deposition layer of the copper ink-printed sample after the hot wire method atomic hydrogen treatment was subjected to a formic acid gas treatment and evaluated in the same manner as in Example 6. The front surface color was dull copper color, and the glass substrate surface side had copper color with metallic gloss. The volume resistivity was $8.0 \times 10^{-8}$ Ω·m. In addition to that, the evaluation results are presented in Table 2.

Example 12

The copper foil substrate used in Example 1 was immersed in an acidic palladium seeder solution (manufactured by Hitachi Chemical Co., Ltd., trade name: PD301 250 g/L, manufactured by Hitachi Chemical Co., Ltd., trade name: HS202B 30 mL/L) at room temperature for 10 minutes, and then was treated with a 1 M aqueous solution of sulfuric acid for one minute. The substrate was washed by immersing in ultrapure water, and was dried at room temperature. Thus, a substrate seeded with palladium particles on the substrate surface was obtained.

The copper ink of Example 5 was applied on the palladium particle-seeded substrate with a baker applicator with the gap adjusted to 100 μm. Thereafter, the substrate was placed on a hot plate heated to 100° C. and was dried for 15 minutes to form a copper-based particle deposition layer. Thus, a copper ink-applied substrate was obtained.

The copper ink-applied substrate was subjected to a formic acid gas treatment and evaluated in the same manner as in Example 5. As a result, no precipitation of copper occurred in the reactor other than the copper ink-applied substrate. The surface resistivity of the conductor layer was 0.019Ω/□. In addition to that, the evaluation results are presented in Table 2.

Comparative Example 3

The copper ink-printed substrate of Example 5 was subjected to a formic acid gas treatment and evaluated in the same manner as in Example 5, without attaching platinum particles. The evaluation results are presented in Table 2.

TABLE 2

| Item | Type of catalyst added to CuO particles | Thickness (μm) | Volume resistivity ($\times 10^{-8}$ Ω·m) | Surface color of sample after treatment | Deep-part reducibility | Copper precipitation to outside applied area |
|---|---|---|---|---|---|---|
| Example 1 | Cu Powder (10%) | 5 | 30 | Copper color | Present | None |
| Example 4 | Copper ink (5%) | 8 | 24 | Copper color | Present | None |
| Example 5 | Platinum Powder | 1 | 9 | Copper color | Present | None |
| Example 6 | Palladium Powder | 1 | 33 | Copper color | Present | None |
| Example 7 | Silver particles | 1 | 8 | Copper color | Present | None |
| Example 8 | Nickel Powder | 1 | 35 | Copper color | Present | None |
| Example 9 | (PPh$_3$)$_3$RhCl | 1 | 24 | Copper color | Present | None |
| Example 10 | Copper (II) formate | 1 | 14 | Copper color | Present | None |
| Example 11 | Atomic hydrogen treatment[a] | 1 | 8 | Copper color | Present | None |
| Example 12 | Pd seeder[b] | 5 | 9 | Copper color | Present | None |
| Comparative Example 3 | None | 0 | No conduction | Copper color[c] | Present | Large amount |

[a] Without addition of particles, the sample surface was reduced with atomic hydrogen.
[b] A CuO ink was applied on a substrate to which Pd particles had been attached.
[c] Spotted Comparative Example 4

A 5 mass % aqueous solution of copper formate hydrate (manufactured by Sigma-Aldrich Company) was applied on a copper foil-attached epoxy substrate (E-679F, manufactured by Hitachi Chemical Co., Ltd.) with etched copper foil, and was dried on a hot plate at 110° C. Thus, a substrate in which copper formate hydrate was attached on the substrate as crystal grains was obtained. This substrate was placed on a hot plate heated to 160° C., and was covered with an inverted funnel. Nitrogen was allowed to flow from the glass tube side of the funnel, and thereby, the substrate was treated in a nitrogen atmosphere for 20 minutes.

The copper formate-applied area changed to copper color, and the substrate in the surroundings of the copper formate-applied area also changed to copper color.

The conductor layer was evaluated in the same manner as in Example 1, and the film thickness determined from a SEM image of an FIB-processed cross-section of the copper formate-applied area after the treatment was 6 μm, while the volume resistivity determined from the measurement of surface resistance was $4.2 \times 10^{-6}$ Ω·m.

As described above, copper formate was thermally decomposed to produce copper metal. Furthermore, copper formate was sublimable, and copper metal was precipitated out even on the substrate in the surroundings of the applied area.

Comparative Example 5

The processes were carried out in the same manner as in Example 2, except that isopropanol was used in place of formic acid as the treating gas, and a treated sample was obtained. The surface resistance was measured with a four-probe method low resistivity meter (Loresta GP, manufactured by Mitsubishi Chemical Corp.), but the resistance was equal to or higher than the measurement limit, that is, no conduction was seen. The surface color was observed by visual inspection, but the color was the same black color as that before the treatment, and no change before and after the isopropanol gas treatment was seen. In addition to that, the evaluation results are presented in Table 3.

Comparative Example 6

The processes were carried out in the same manner as in Example 2, except that ethylene glycol was used in place of formic acid as the treating gas, and a treated sample was obtained. The sample was evaluated in the same manner as in Comparative Example 5, and no conduction was seen. The surface color remained black, and no change was observed. In addition to that, the evaluation results are presented in Table 3.

Comparative Example 7

The processes were carried out in the same manner as in Example 2, except that acetic acid was used in place of formic acid as the treating gas, and thus a treated sample was obtained. The sample was evaluated in the same manner as in Comparative Example 5, and no conduction was seen. The surface color remained black, and no change was observed. In addition to that, the evaluation results are presented in Table 3.

Comparative Example 8

The processes were carried out in the same manner as in Example 2, except that a mixture of acetic acid and ethylene glycol was used in place of formic acid as the treating gas, and thus a treated sample was obtained. The sample was evaluated in the same manner as in Comparative Example 5, and no conduction was seen. The surface color remained black, and no change was observed. In addition to that, the evaluation results are presented in Table 3.

Comparative Example 9

The processes were carried out in the same manner as in Example 2, except that acetaldehyde was used in place of formic acid as the treating gas, and thus a treated sample was obtained. The sample was evaluated in the same manner as in Comparative Example 5, and no conduction was seen. The surface color remained black, and no change was observed. In addition to that, the evaluation results are presented in Table 3.

Comparative Example 10

The processes were carried out in the same manner as in Example 2, except that a mixture of acetic acid and acetaldehyde was used in place of formic acid as the treating gas, and thus a treated sample was obtained. The sample was evaluated in the same manner as in Comparative Example 6, and no conduction was seen. The surface color remained black, and no change was observed. In addition to that, the evaluation results are presented in Table 3.

TABLE 3

| | Treating gas | Volume resistivity ($\Omega \cdot m$) | Surface color of sample after treatment |
|---|---|---|---|
| Example 2 | Formic acid | $5.7 \times 10^{-7}$ | Copper color |
| Comparative Example 5 | Isopropanol | No conduction | Black color |
| Comparative Example 6 | Ethylene glycol | No conduction | Black color |
| Comparative Example 7 | Acetic acid | No conduction | Black color |
| Comparative Example 8 | Ethylene glycol + acetic acid | No conduction | Black color |
| Comparative Example 9 | Acetaldehyde | No conduction | Black color |
| Comparative Example 10 | Acetaldehyde + acetic acid | No conduction | Black color |

Example 13

In order to evaluate the reducibility of the copper ink deep parts, the ink was subjected to a thick film evaluation. A paste-like copper ink was prepared by weighing 40.5 g of CuO nanoparticles and 4.5 g of Cu nanoparticles with naturally oxidized surface (CuO particles:Cu particles=90:10) in a Polybottle, adding 5 g of γ-butyrolactone so that the solids content would be 45 mass %, tightly stopping the bottle, subsequently mixing the content by shaking, and then treating the mixture with an ultrasonic cleaner (B5510J-MTH, manufactured by Branson Ultrasonics Corp.) for 60 minutes.

This paste-like copper ink was extruded from a capillary syringe, and was attached on a glass preparation in the form of a mound having a thickness of 0.8 mm. The copper ink was dried to form a copper-based particle deposition layer, and then was treated with formic acid gas in the same manner as in Example 1.

Figure 5:
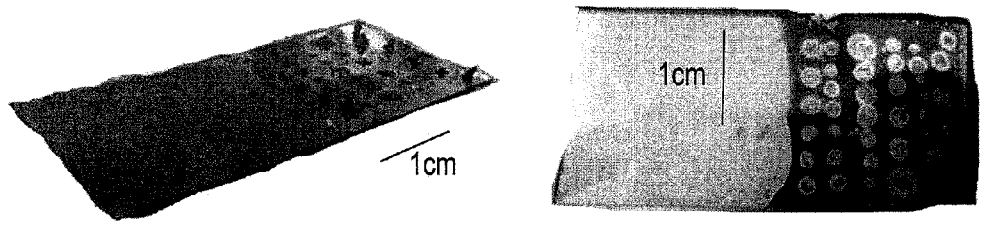
FIG. 5 is drawing-substitute photographs showing the states of a copper metal film produced in Example 13 observed (A) from the front surface, (B) from the back surface (glass substrate side).

The entire mound turned to copper color in the visual inspection from the glass substrate side, and it was considered that the copper ink had deep-part reducibility. FIG. 5 shows drawing-substitute photographs obtained by observing the appearance. FIG. 5(B) shows the photograph obtained by observing the copper ink from the glass substrate side.

Comparative Example 11

A copper ink prepared in the same manner as in Comparative Example 1 was applied on a glass preparation with a baker applicator, and the glass preparation was placed on a hot plate heated to 100° C. and dried for 15 minutes. Thus, a copper ink-applied sample on which a copper-based particle deposition layer was formed was obtained. This copper ink-applied sample was mounted in the reactor for formic acid gas treatment of Example 1, and nitrogen gas containing formic acid gas was introduced therein. The sample was heated from room temperature to 160° C., and after reaching 160° C., the sample was treated for 60 minutes. As a result, the copper ink-applied sample changed to copper color with spots, and a large amount of copper precipitated out in the surroundings and even the inner walls of the reactor.

Example 14

Preparation of Copper Ink

A copper ink was prepared in the same manner as in Example 5.

(Production of Substrate)

10 g of a bisphenol A-novolac epoxy resin (N865, Dainippon Ink & Chemicals, Inc.), 7.26 g of a curing agent (LA3018, manufactured by Dainippon Ink & Chemicals, Inc.), 0.017 g of 2-ethyl-4-methylimidazole (manufactured by Wako Pure Chemical Industries, Ltd.), and 0.022 g of a surface tension adjusting agent (307, manufactured by BYK-Chemie GmbH) were dissolved in 24.2 g of 2-acetoxy-1-methoxypropane (manufactured by Wako Pure Chemical Industries, Ltd.), and thus a resin solution was obtained. On a glass preparation that had been UV/$O_3$ treated with a desktop type surface treatment apparatus (PL16-110A, manufactured by Sen Lights Co., Ltd.), the resin solution was spin coated under the conditions of 1500 rpm and 60 sec. The resin solution was dried on a hot plate at 100° C. for 10 minutes, and then was cured on a hot plate at 180° C. for 30 minutes. Thus, a resin-coated substrate was produced.

(Production of Copper Ink-Applied Sample)

The copper ink was inkjet printed on the resin-coated substrate in the same manner as in Example 6, and thus a copper ink-printed sample was obtained.

(Hot Wire Method Atomic Hydrogen Treatment)

The copper ink-printed sample was subjected to a hot wire method atomic hydrogen treatment in the same manner as in Example 11, and thus a copper-based particle deposition layer was formed. The sample front surface after the hot wire method atomic hydrogen treatment had dark brown color, and the sample back surface observed from the glass substrate had black color. In regard to the surface resistance measurement, the resistance was equal to or higher than the measurement limit, and no conduction was observed.

(Formic Acid Gas Treatment)

The formic acid gas treatment of the copper ink-printed sample that had been subjected to a hot wire method atomic hydrogen treatment was carried out in the same manner as in Example 1. The volume resistivity after the treatment was $7.8 \times 10^{-8} \Omega \cdot m$.

(Measurement of Substrate Adhesiveness)

The substrate adhesiveness of the copper ink-printed layer after the formic acid gas treatment was determined by measuring the peeling strength by SAICAS. The average peeling strength was 0.32 kN/m.

The substrate adhesiveness of the formic acid gas treated copper ink-printed layer was 2.3 times the value of Comparative Example 13, and thus the adhesive force was enhanced. The adhesion area increased due to the presence of a dense layer along the substrate shown in FIG. 3, and it is believed that the adhesive force enhanced.

Comparative Example 12

Production of Copper Ink-Printed Sample

A copper ink-printed sample was produced in the same manner as in Example 14.

(Hot Wire Method Atomic Hydrogen Treatment)

The hot wire method atomic hydrogen treatment was carried out using a hot wire atomic hydrogen treatment apparatus introduced with hydrogen, under the conditions of a hydrogen flow rate of 70 sccm, a pressure in the tank of 0.4 Pa, a tungsten wire input power of 1030 W, a tungsten wire temperature of 1800° C. (measured with a radiation thermometer), and a treatment time of 40 minutes. The sample front surface after the treatment had copper color, and the sample back surface observed from the glass substrate side had dark brown color. The copper ink was reduced to the back surface at a thickness of 1.7 µm. The volume resistivity was $1.7 \times 10^{-6} \Omega \cdot m$.

(Measurement of Substrate Adhesiveness)

The average peeling strength measured in the same manner as in Example 14 was 0.14 kN/m.

Example 15

A conductorization treatment using formaldehyde in place of formic acid gas was carried out. The details will be described below.

In the same manner as in Example 11, a copper ink-printed film surface was reduced with hot wire method atomic hydrogen, and a sample in which the copper ink-printed tank surface was made of copper metal was produced (volume resistivity $6.0 \times 10^{-6} \Omega \cdot m$.

10 g of para-formaldehyde was introduced into a 100-ml pear-shaped flask, and a three-way sliding cock was provided. A 20-cm long injection needle was inserted through the upper glass tube, and the gap between the glass tube was sealed with Parafilm. While nitrogen was allowed to flow through the injection needle, the pear-shaped flask was heated by immersing in an oil bath at 160° C., and nitrogen gas containing formaldehyde was obtained through a side tube of the three-way cock. Sea sand was spread on the bottom of a separable flask having a flat bottom, which had been heated in an oil bath, and then the sample was placed on the sea sand. A chromel-alumel thermocouple was mounted on the surface of this sample, and the sample temperature was measured. While nitrogen containing formaldehyde was allowed to flow into the separable flask in which this sample was placed, the flask was heated in an oil bath at 197° C. Thus, the sample was treated for 60 minutes at a sample temperature of 160° C. After the treatment, the formic acid gas generator was separated, and while nitrogen was allowed to flow in, the separable flask was left to cool. After the sample was brought to 50° C. or lower, the sample was taken out in air. As a result, the front surface color of the sample changed from dark brown color to brown color, and the color on the glass substrate side changed from black color to red copper color. The volume resistivity was $5.4 \times 10^{-7} \Omega \cdot m$.

Example 16

The copper ink-applied sample produced in the same manner as in Example 1 was treated with formaldehyde in the same manner as in Example 15. As a result, the copper ink surface changed from black color to dull copper color, and the glass substrate side also changed from black color to dull copper color. The copper ink that did not exhibit conduction before the treatment, exhibited conduction at a volume resistivity of $9.0 \times 10^{-7} \Omega \cdot m$ after the treatment.

As can be seen from Example 15 and Example 16, the copper ink was conductorized also by heating together with formaldehyde gas. When these examples are respectively compared with Example 1 and Example 11 treated with formic acid gas, even though the samples were treated for one hour, the color tone of the copper ink after the treatment was slightly dark, and the volume resistivity was also increased. Thus, the effect was slightly lower with formaldehyde than with formic acid gas.

REFERENCE SIGNS LIST

12 Catalytically active metal component
13 Copper oxide component

14 Particles containing catalytically active component
15 Particles containing copper oxide component
16, 19 Substrate
17, 21, 22 Particle layer formed of catalytically active metal component
18, 20 Particle deposition layer formed of copper oxide component
23 Film of catalytically active metal component
24 Particle deposition layer formed of copper oxide component

The invention claimed is:

1. A method for producing a copper metal film, comprising: producing gaseous formic acid by converting liquid formic acid to gaseous formic acid, and treating a copper-based particle deposition layer containing both copper oxide and a metallic transition metal or alloy, or a transition metal complex containing a metal element, with the gaseous formic acid converted from liquid formic acid, the gaseous formic acid being heated to 120° C. or higher, wherein a ratio of copper oxide to the metallic transition metal or alloy or the transition metal complex containing a metal element in the copper-based particle deposition layer is 9:1 to 100,000:1.

2. The method for producing a copper metal film according to claim 1, wherein the copper oxide comprises cuprous oxide and/or cupric oxide.

3. The method for producing a copper metal film according to claim 1, wherein the transition metal, the alloy, and the transition metal complex are a metal selected from the group consisting of Cu, Pd, Pt, Ni, Ag, Au and Rh, an alloy containing the metal, and a complex containing the metal element, respectively.

4. The method for producing a copper metal film according to claim 1, wherein as the copper oxide, and the metallic transition metal or alloy, or the transition metal complex containing a metal element, the copper metal film contains particles comprising a core/shell structure in which the core part is formed of the transition metal or alloy, and the shell part is formed of the copper oxide.

5. The method for producing a copper metal film according to claim 1, wherein the metallic transition metal is copper metal obtained by reducing a portion of the copper-based particle deposition layer.

6. The method for producing a copper metal film according to claim 5, wherein the technique for reducing a portion of the copper-based particle deposition layer is any one of (1) a hot wire method atomic hydrogen treatment, (2) a surface wave plasma treatment, (3) an RF plasma treatment, (4) heating under hydrogen, (5) a treatment using a treatment liquid which contains, in a single solution, both an agent which ionizes or complexates copper oxide, and a reducing agent which reduces copper ions or a copper complex to copper metal, but does not contain copper ions, and (6) an atomic hydrogen treatment through ultraviolet irradiation.

7. The method for producing a copper metal film according to claim 1, wherein the copper-based particle deposition layer is a layer obtained by depositing a particle mixture prepared by mixing particles formed of the metallic transition metal or alloy, or the transition metal complex containing a metal element, with copper oxide particles at an arbitrary ratio.

8. The method for producing a copper metal film according to claim 1, wherein the copper-based particle deposition layer is a layer obtained by depositing a particle mixture prepared by mixing particles formed of the metallic transition metal or alloy, or the transition metal complex containing a metal element, with particles comprising a core-shell structure in which the core part is formed of the metal and the shell part is formed of copper oxide, and with copper oxide particles, at an arbitrary ratio.

9. The method for producing a copper metal film according to claim 1, wherein the copper-based particle deposition layer is a layer obtained by depositing one or more layers containing copper oxide particles, on a layer obtained by depositing particles formed of the metallic transition metal or alloy, or the transition metal complex containing a metal element, with the layers being in contact.

10. The method for producing a copper metal film according to claim 1, wherein the copper-based particle deposition layer is a layer obtained by laminating a layer containing the metallic transition metal or alloy, or the transition metal complex containing a metal element, on a layer obtained by laminating one or more layers containing copper oxide particles.

11. The method for producing a copper metal film according to claim 1, wherein the copper-based particle deposition layer is a layer obtained by laminating one or more layers containing copper oxide particles, on a film containing the metallic transition metal or alloy, or the transition metal complex containing a metal element.

12. The method for producing a copper metal film according to claim 1, wherein the treating of the copper-based particle deposition layer with gaseous formic acid heated to 120° C. or higher comprises forming gaseous formic acid by converting liquid formic acid to gaseous formic acid at a temperature of 120° C. or higher and then leading the gaseous formic acid at a temperature of 120° C. or higher to the copper-based particle deposition layer.

13. The method for producing a copper metal film according to claim 1, wherein a ratio of copper oxide to the metallic transition metal or alloy or the transition metal complex containing a metal element in the copper-based particle deposition layer is 10:1 to 10,000:1.

* * * * *